(12) United States Patent
O'Regan et al.

(10) Patent No.: US 6,849,869 B1
(45) Date of Patent: Feb. 1, 2005

(54) LONG LIFETIME POLYMER LIGHT-EMITTING DEVICES WITH IMPROVED LUMINOUS EFFICIENCY AND IMPROVED RADIANCE

(75) Inventors: Marie B. O'Regan, Santa Barbara, CA (US); Chi Zhang, Goleta, CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 0 days.

(21) Appl. No.: 09/617,858

(22) Filed: Jul. 17, 2000

Related U.S. Application Data

(60) Provisional application No. 60/144,251, filed on Jul. 19, 1999.

(51) Int. Cl.[7] .............................................. H01L 35/24
(52) U.S. Cl. .............................. 257/40; 257/79; 257/81; 257/98; 257/99; 438/99
(58) Field of Search ...................... 257/40, 918; 438/99, 438/22, 82

(56) References Cited

U.S. PATENT DOCUMENTS

| | | |
|---|---|---|
| 5,047,687 A | 9/1991 | VanSlyke |
| 5,059,862 A | 10/1991 | VanSlyke et al. |
| 5,151,629 A | 9/1992 | VanSlyke |
| 5,247,190 A | 9/1993 | Friend et al. |
| 5,317,169 A | 5/1994 | Nakano et al. |
| 5,408,109 A | 4/1995 | Heeger et al. |
| 5,469,018 A | 11/1995 | Jacobsen |
| 5,512,654 A | 4/1996 | Holmes et al. |
| 5,616,986 A | 4/1997 | Jacobsen et al. |
| 5,619,058 A | 4/1997 | Kim |
| 5,626,795 A | 5/1997 | Smith et al. |
| 5,723,873 A | 3/1998 | Yang |
| 5,747,930 A | 5/1998 | Utsugi |
| 5,764,324 A * | 6/1998 | Lu et al. ..................... 349/113 |
| 5,780,174 A | 7/1998 | Tokito et al. |
| 5,844,363 A * | 12/1998 | Gu et al. ..................... 313/506 |
| 5,877,038 A * | 3/1999 | Coldren et al. ............... 438/39 |
| 6,117,529 A * | 9/2000 | Leising et al. .............. 428/209 |
| 6,121,727 A * | 9/2000 | Kanai et al. ................ 313/504 |
| 6,137,819 A * | 10/2000 | Najda .......................... 372/96 |
| 6,274,979 B1 * | 8/2001 | Celii et al. .................. 313/506 |
| 6,366,017 B1 * | 4/2002 | Antoniadis et al. ......... 313/506 |

FOREIGN PATENT DOCUMENTS

| | | | |
|---|---|---|---|
| EP | 0668620 | 8/1995 | |
| WO | WO98/10621 | 3/1998 | |
| WO | WO 98/10621 | * 12/1998 | ........... H05B/33/26 |
| WO | WO99/59370 | 11/1999 | |

OTHER PUBLICATIONS

Helmut F. Wolf, "Semiconductor". copy right 1971, by John Wiley & Sons, Inc., p. 424, Table 5.4.*

"Complete Guide to Semiconductor Device" by Kwok Ng, 1995 Ed., p. 60–61.*

Dodabalapur, A. et al.; Microcavity effects in organic semiconductors; Appl. Phys. Lett.; May 9, 1994; 2486–2488; 64(19); American Institute of Physics.

Fisher, T. A. et al.; Electroluminescence from a conjugated polymer microcavity structure, Appl. Phys. Lett.; Sep. 4, 1995; 1355–1357; 67(10); American Institute of Physics.

(List continued on next page.)

*Primary Examiner*—Long Pham
*Assistant Examiner*—Wai-Sing Louie

(57) ABSTRACT

The luminous efficiency and radiance of light emitting diodes (LEDs) fabricated from organic emissive materials can be increased by using a multilayer cathode including a low work function layer and a high work function high reflectivity layer, in combination with a high work function, high reflectivitity anode material in the device.

23 Claims, 4 Drawing Sheets

OTHER PUBLICATIONS

Tessler, N. et al.; Lasing from conjugated–polymer microcavities; Nature; Aug. 22, 1996; 695–697, vol. 382.

Wittmann, Herman F.; Microcavity Effect in a Single–Layer Polymer Light–Emitting Diode; Adv. Mater.; 1995; 541–544; VCH Verlagsgesellschaft mbH, Weinheim.

Takada, Noriyuki et al.; Control of emission characteristics in organic thin–film electroluminescent diodes using an optical–microcavity structure; Appl. Phys. Lett.; Oct. 11, 1993; 2032–2034; 63(15); American Institute of Physics.

Tsutsui, Tetsuo et al.; Sharply directed emission in organic electroluminescent diodes with an optical–microcavity structure; Appl. Phys. Lett.; Oct. 10, 1994; 1868–1870; 65(15); American Institute of Physics.

Cacialli, F. et al.; Light–Emitting Conjugated Polymers in Optical Microcavities; Synthetic Metals; 1997; 533–534; 84; Elsevier Science S.A.

Parker, I.D. et al.; Carrier tunneling and device characteristics in polymer light–emitting diodes; J. Appl. Phys.; Feb. 1, 1994; 1656–1666; 75(3); American Institute of Physics.

Burroughes, J.H. et al.; Light–emitting diodes based on conjugated polymers, Nature; Oct. 11, 1990; 539–541; vol. 347.

Braun, D. et al.; Visible light emission from semiconducting polymer diodes; Appl. Phys. Lett.; May 6, 1991; 1982–1894; 58(18); American Institute of Physics.

Gustafsson; G. et al.; Flexible light–emitting diodes made from soluble conducting polymers; Nature; Jun. 11, 1992; 477–479; vol. 357.

Yang, Y. et al; Polyaniline as a transparent electrode for polymer light–emitting diodes; Lower operating voltage and higher efficiency; Appl. Phys. Lett.; Mar. 7, 1994; 1245–1247; 64(10); American Institute of Physics.

Yang Y. et al.; Enhanced performance of polymer light–emitting diodes using high–surface area polyaniline network electrodes; J. Appl. Phys.; Jan. 15, 1995; 694–698; 77(2); American Institute of Physics.

Kido, J. et al.; Single–layer white light–emitting organic electroluminescent devices based on dye–dispersed poly(N–vinylcarbazole); Appl. Phys. Lett.; Oct. 16, 1995; 2281–2283; 67(16); American Institute of Physics.

Scott, J.C. et al.; Degradation and failure of MEH–PPV light–emitting diodes; J. Appl. Phys.; Mar. 1, 1996; 2745–2751; 79(5); American Institute of Physics.

Parker, I.D. et al.; Fabrication of polymer light–emitting diodes using doped silicon electrodes; Appl. Phys. Lett.; Apr. 4, 1994; 1774–1776; 64(14); American Institute of Physics.

Diaz–Garcia, Maria A. et al.; "Plastic" lasers: Comparison of gain narrowing with a soluble semiconducting polymer in waveguides and microcavities; Appl. Phys. Lettl; Jun. 16, 1997; 70(24); American Institute of Physics.

Kowalsky, Wolfgang et al.; Improved Lifetime and Efficiency of Organic Light Emitting Diodes for Applications in Displays; SPIE Conference on Light–Emitting Diodes: Research, Manufacturing and Applications III; Jan. 1999; 103–114; San Jose, California.

Jordan, R.H. et al.; Efficiency enhancement of microcavity organic light emitting diodes; Appl. Phys. Lett.; Sep. 30, 1996; 1997–1999; 69(14); American Institute of Physics.

Scott, J.C. et al., Hole limited recombination in polymer light–emitting diodes; Appl. Phys. Lett.; Mar. 15, 1999; 1510–1512; 74(11); American Institute of Physics.

* cited by examiner

LONG LIFETIME POLYMER LIGHT-EMITTING DEVICES WITH IMPROVED LUMINOUS EFFICIENCY AND IMPROVED RADIANCE

This application claims benefit of provisional patent application No. 60/144,251, filed Jul. 19, 1999.

BACKGROUND OF THE INVENTION

1. Field of the Invention

This invention relates to organic polymer light-emitting diodes with improved luminous efficiency and improved radiance.

2. Description of the Related Art

Diodes and particularly light emitting diodes (LEDs) fabricated with conjugated organic polymer layers have attracted attention due to their potential for use in display technology. A standard polymer LED architecture includes the following layers in contact sequence: a substrate with a coating of indium-tin oxide (ITO), a passivation layer, emissive polymer, followed by a single-layer cathode. [See for example, Burroughs, J. H., Bradley, D. D. C., Brown, A. R., Marks, R. N., Mackay, K., Friend, R. H., Burns, P. L., and Holmes, A. B., "Light-emitting diodes based on conjugated polymers," *Nature*, 1990, 347, 539; Braun, D., and Heeger, A. J., "Visible light emission from semiconducting polymer diodes," *Appl. Phys. Lett.*, 1991, 58, 1982.]

In the field of organic polymer-based LEDs, it is common to employ a relatively high work function metal as the anode, which serves to inject holes into the otherwise filled π-band of the semiconducting, electroluminescent polymer. Relatively low work function metals are preferred as the cathode material, which serves to inject electrons into the otherwise empty π*-band of the semiconducting, electroluminescent polymer. The holes which are injected at the anode and the electrons which are injected at the cathode recombine radiatively within the active layer and light is emitted. Proposed criteria for suitable electrodes are described in detail by Parker, I. D., "*Carrier tunneling and device characteristics in polymer light-emitting diodes,*" *J. Appl. Phys.*, 1994, 75, 1656.

Typical relatively high work function materials for use as anode materials include transparent conducting thin films of indium/tin-oxide (see, for example Burroughs, J. H., Bradley, D. D. C., Brown, A. R., Marks, R. N., Mackay, K., Friend, R. H., Burns, P. L., and Holmes, A. B., "*Light-emitting diodes based on conjugated polymers,*" *Nature*, 1990, 347, 539; Braun, D., and Heeger, A. J., "*Visible light emission from semiconducting Polymer diodes,*" *Appl. Phys. Lett.*, 1991, 58, 1982.) Alternatively, thin films of polyaniline in the conducting emeraldine salt form can be used (see, for example Cao, Y., P. Smith and Heeger, A. J., U.S. Pat. No. 5,626,795; G. Gustafsson, G., Cao, Y., Treacy, G. M., Klavetter, F., Colaneri, N., and Heeger, A. J., "*Flexible Light-emitting diodes made from soluble conducting polymers,*" *Nature*, 1992, 357, 477; Yang Y. and Heeger, A. J., "*Polyaniline as a transparent electrode for polymer light-emitting diodes: lower operating voltage and higher efficiency,*" *Appl. Phys. Lett.*, 1994, 64, 1245; Yang et al., "Bilayer composite electrodes for diodes," U.S. Pat. No. 5,723,873; Yang, Y., Westerweele, E., Zhang, C., Smith, P., and Heeger, A. J., "*Enhanced performance of polymer light-emitting diodes using high-surface area polyaniline network electrode,*" *J. Appl. Phys.*, 1995, 77, 694). Thin films of indium/tin-oxide and thin films of polyaniline in the conducting emeraldine salt form are traditionally preferred because, as transparent electrodes, both permit the emitted light from the LED to radiate from the device in useful levels.

Typical relatively low work function metals that are suitable for use as cathode materials are metals such as calcium, magnesium, and barium. Alkali metals tend to be too mobile and act to dope the emissive layer (e.g., electroluminescent polymer), thereby causing shorts and unacceptably short device lifetimes. Alloys of these low work function metals, for example, alloys of magnesium in silver and alloys of lithium in aluminum, are also known (see, for example, VanSlyke, U.S. Pat. No. 5,047,687; VanSlyke, S. A., Tang, C. W., U.S. Pat. No. 5,059,862; Heeger et al., U.S. Pat. No. 5,408,109.) The thickness of the electron injection cathode layer typically ranges from about 200 to about 5000 Å (see, for example, VanSlyke, U.S. Pat. No. 5,151,629; Friend et al., U.S. Pat. No. 5,247,190; Nakano et al., U.S. Pat. No. 5,317,169; Kido, J., Shionoya, H., and Nagai, K., "*Single-layer white light-emitting organic electroluminescent devices based on dye-dispersed poly(N-vinylcarbazole),*" *Appl. Phys. Lett.*, 1995, 67, 2281.) A lower limit of about 200 to about 500 Å is required in order to form a continuous film (full coverage) for a cathode layer (see, for example, Holmes et al., U.S. Pat. No. 5,512,654; Utsugi, U.S. Pat. No. 5,747,930; Scott, J. C., Kaufman, J. H., Brock, P. J., DiPietro, R., Salem, J., and Goitia, J. A. *J. Appi. Phys*, 1996, 79, 2745; Parker, I. D. and Kim, H. H., "*Fabrication of polymer light-emitting diodes using doped silicon electrodes,*" *Appl. Phys. Lett.*, 1994, 64, 1774). In addition to good coverage, thicker cathode layers were believed to provide self-encapsulation to keep oxygen and water vapor away from the active parts of the device.

It is known in the art that cathodes in the form of an ultrathin layer of either a low work function metal [see Cao, Y.; U.S. patent application Ser. No. 08/872,657 and Pichler, K., International patent application WO 98/10621] or an ultrathin layer of a low work function metal oxide [Cao, Y.; U.S. patent application Ser. No. 09/173,157] yield LEDs which offer comparable or better initial performance (e.g., brightness and efficiency) and extended operating lifetime, as compared to similar LEDs which employ conventional thick film cathodes.

Despite the improvements in the fabrication of polymer LEDs, issues remain to be resolved. For example, the brightness and efficiency of polymer LEDs are sufficient for them to be used in certain display applications. However, in battery operated devices, the luminous efficiency is a critical parameter. Higher luminous efficiency results directly in a longer period of use without recharging the battery. More generally, higher luminous efficiency enables use in a wider range of display applications. Thus, a need exists for polymer LEDs with higher luminous efficiency. In specific applications, the light output is preferred to be in a narrow cone in the forward direction. In such applications, high radiance is especially important.

For display applications, it is useful to measure light emitted as seen by a human observer, that is, in units that take into account the response of the human eye. Such units are called photopic units. One of the most commonly used photopic units to measure light output is candelas/Amp (cd/A). The light output in cd/A is a measure of the luminous efficiency.

The light output can also be measured in radiometric units, where the basic unit is the Watt per unit solid angle (W/sr/m$^2$). Watts are absolute units because they are independent of wavelength; a Watt of visible light has the same power as a Watt of infrared light. In the Description of the Invention section, results from devices are quoted in both photometric and radiometric units, i.e., in Cd/A (luminous efficiency) and W/sr/m² (radiance). The radiance is a measure of power delivered into the "forward direction".

Jacobsen, S. M.; Jaffe, S. M.; Eilers, H.; Jones, M. J. U.S. Pat. No. 5,616,986 and Jacobsen, S. M.; Jaffe, S. M.; Eilers, H.; Jones, M. J. U.S. Pat. No. 5,469,018 teach the use of microcavity resonators with luminescent inorganic phosphor layers.

There have been many reports in the literature on microcavity devices fabricated with organic and polymer materials. Both metal etalon structures (where each electrode is a high reflectivity metal) and Distributed Bragg Reflector (DBR) structures (where one mirror is a stack of alternating high and low refractive index layers, called a DBR) have been employed. Microcavity structures are employed in conjugated polymer systems in order to tune the emission of the semi-conducting polymer to enable multi-color display applications (for example, see A. Dodabalapur, L. J. Rothberg, T. M. Miller and E. W. Kwock, *Appl. Phys. Lett.* 1994, 64, 2486; T. A. Fisher; D. G. Lidzey; M. A. Pate; M. S. Weaver, D. M. Whittaker, M. S. Skolnick, D. D. C. Bradley *Appl. Phys. Lett.* 1995, 67, 1355;Microcavity structures are also under investigation as resonant structures for lasers which utilize conjugated polymers as the gain materials [see for example, Tessler, N., Denton, G. J., and Friend, R. H., *Nature,* 1996, 382, 695; Diaz-Garcia, M. A.; Hide, F.; Schwartz, B. J.; McGehee, M. D.; Andersson, M. R.; Heeger, A. J., *Appl. Phys. Lett.* 1997, 70, 3191]. The resonant frequency of an optical microcavity is based on Equation (1):

$$m\lambda_{res} = 2\Sigma_i n_i d_i \qquad \text{Equation (1)}$$

where $\lambda_{res}$ is the resonant frequency of the cavity, m=the number of modes in the cavity, $n_i$ is the refractive index of the polymer layer i and $d_i$ is the thickness of the polymer layer i. The index, $n_i$ of conjugated polymers depends on the band gap and molecular structure; typical values range from 1.8 to 2. As an example, if peak emission at 640 nm ($\lambda_{res}$=640 nm) is desired with $n_i$=2.2, the total thickness of the polymer layers should be approximately 140 nm (at m=1). Thus, it is possible to tune the wavelength of the emitted light by changing the thickness of the layers between the two mirrors. It is on this property of optical microcavities that the multi-color display applications are based.

It Is generally accepted that microcavity structures fabricated with distributed Bragg reflector (DBR) mirrors are more desirable than metal etalon microcavities (see Wittman, H. F. et at, *Adv. Mater.* 1995, 7, 541) because there are fewer photons lost by absorption in the cavity. The losses in metal etalon structures are attributed to absorption by the metal layers. Tsutsui et al. reported that the emission intensity from a silver microcavity device was weaker than that from a non-microcavity device with ITO as the anode layer, even though the FWHM of emission was narrower in the silver device (N. Takada, T. Tsutsui, S. Saito, *Appl. Phys. Lett.* 1993, 63, 2032). In a subsequent paper dealing with DBR-based structures (T. Tsutsui, N. Takada, S. Saito, E. Ogino, *Appl. Phys. Lett.* 1994, 65, 1868) the authors refer to the poor operating lifetime obtained with silver devices relative to devices with ITO anodes. The poor performance is attributed to poor Ag film uniformity, and the authors state that they overcome the problem by using a DBR reflector with an ITO anode.

There are many reports of the use of high reflectivity, semi-transparent metal layers as one electrode in metal etalon microcavity structures. One measure by which microcavities are judged is Q, the quality of the cavity, as expressed in Equation (2):

$$Q = \frac{\pi}{\alpha l - \ln\sqrt{R_1 R_2}} \qquad \text{Equation (2)}$$

where $\alpha l$ refers to the internal absorption loss in the cavity and $R_1$ and $R_2$ are the reflectivities of the mirror surfaces on each side of the cavity It is known that the quality, Q of the cavity is increased by increasing the thickness (reflectivity) of the mirrors. The higher Q is manifested by the narrowing of the spectral bandwidth (described as full-width at half-maximum, FWHM) of the light emitted. However, as one would expect there is a concomitant decrease in light output with increasing metal layer thickness. It is known that silver is a useful metal for the semi-transparent layer through which light is emitted. Silver is a high reflectivity metal that can be vapor deposited to give a smooth, continuous film. For example, see "Light-Emitting Conjugated Polymers in Optical Microcavities, Proceedings of the International Conference on Synthetic Metals, 1997, 84, 533 Cacialli, F.; Hayes, G. R.; Gruner, J.; Phillips, R. T.; Friend, R. H. In this case, the other side of the mirror is a DBR stack with an ITO electrode. No electroluminesence is measured in the device, but photoluminesence is reported.

The same configuration is also used in the polymer laser field. [See for example, Tessler, N., Denton, G. J., and Friend, R. H., *Nature,* 1996, 382, 695; Diaz-Garcia, M. A.; Hide, F.; Schwartz, B. J.; McGehee, M. D.; Andersson, M. R.; Heeger, A. J. *Appl. Phys. Lett.* 1997, 70, 3191].

According to Equation (2) above, the reflectivities of the mirrors should be as high as possible, in order to maximize Q. High reflectivity is essential to high Q microcavities. One would not expect to obtain high Q microcavities with mirrors fabricated from the low work-function metals or metal oxides that have been demonstrated as essential for obtaining efficient, bright and stable polymer LEDs. For example, barium metal has a reflectance of 39.8% at 578 nm (American Institute of Physics Handbook, $2^{nd}$ Ed., McGraw-Hill Book Company, Chapter 6, "Optical Properties of Metals", page 108).

SUMMARY OF THE INVENTION

The present invention relates to a light-emitting diode including an anode that includes a semi-transparent layer having a high reflectivity and a high work function, and a cathode including at least one first cathode layer of a low work function material selected from metal, metal oxide and combinations thereof, and at least one second cathode layer having a high reflectivity and a high work function.

The invention achieves improved luminous efficiency and improved radiance. In a first embodiment, the semi-transparent layer or the second cathode layer has a reflectivity of at least 91.4% and a work function greater than about 4 eV. In a second embodiment, the semi-transparent layer and/or the second cathode layer has a reflectivity of at least 86% at an emission wavelength of between 400 nm and 500 nm. In a preferred embodiment, both the semi-transparent layer and the second cathode layer are silver.

As used herein, the phrase "adjacent to" does not necessarily mean that one layer is immediately next to another layer. An intermediate layer or layers may be provided between layers that are said to be adjacent.

As used herein the phrase "reflectivity . . . at wavelength of emission" refers to the reflectivity of a layer at a particular wavelength of light. The wavelength at which the reflectivity is quoted is that of the peak emission from the device. The reflectivity value is read from standard textbook tables,, in "Optical Properties of metals and semiconductors". J. H. Weaver, H. P. R. Frederikse in CRC Handbook, Page 12–117;

As used herein the phrase "semi-transparent" is defined to mean capable of transmitting at least some light, preferably between about 4% and 25% of the amount of light of a particular wavelength of interest.

DESCRIPTION OF THE PREFERRED EMBODIMENTS

Figure 1:
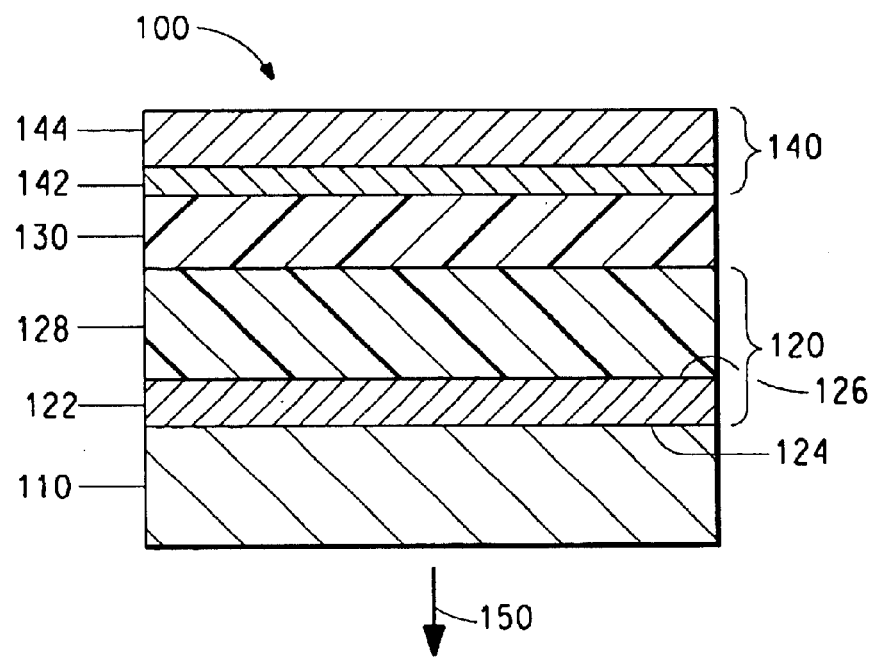
FIG. 1 is a schematic drawing of a polymer LED device configuration useful in the present invention. It is not intended to be to scale.

As best seen in FIG. 1, an LED device 100 includes a substrate 110 and an anode 120. The anode 120 includes a semi-transparent layer 122 of a high reflectivity metal and an optional passivation layer 128. The semi-transparent layer 122 has a first surface 124 adjacent to the substrate 110 and an opposite second surface 126. At least one emissive layer 130 is disposed between the anode 120 and a cathode 140. The cathode 140 includes a first cathode layer 142 of a low-work function material and a second cathode layer 144 of a high reflectivity metal. Light is emitted through substrate 110 as shown by arrow 150.

Substrate

Suitable materials that can be used as a substrate 110 include, for example, glass and polymeric films.

Anode

While it is normal practice to utilize a transparent electrode such as ITO at the side of the device where light is emitted, in order to minimize transmission losses through the electrode the present invention replaces or augments the transparent electrode with a thin layer of high reflectivity metal layer 122 to increase the efficiency of the device. As best seen in FIG. 1, the anode 120 can be a composite layer, made up of the semi-transparent layer 122 and the passivation layer 128 of conductive polymer coated on the second surface 124 of the semi-transparent layer 122.

In a first alternate embodiment (not shown), the anode includes only a conductive, current carrying layer that can serve as a hole-injecting layer, and does not include a passivation layer. In a second alternate embodiment (not shown), the anode includes a transparent conductive layer such as ITO adjacent to the first surface 124 of the semi-transparent layer 122 as well as the passivation layer 128. In a third alternate embodiment (not shown), the anode includes a transparent conductive layer such as ITO adjacent to the first surface 124 of the semi-transparent layer 122 and does not include a passivation layer. The semi-transparent layer 122 of the composite anode 120 or the alternative single anode layer (not shown) is made of an anode material selected from the group of high reflectivity metals of high work function (typically greater than about 4.0 eV). Examples of suitable metals include silver, gold, aluminum and copper. In a preferred embodiment, the semi-transparent layer 122 has a reflectivity of at least 91.4% at emission wavelength, is a good electrical conductor (having a conductivity of from about $10^2$ to about $10^8$ $\Omega^{-1}$ $cm^{-1}$, and being capable of forming into a smooth, contiguous film. In a second preferred embodiment, the semi-transparent layer has a reflectivity of more than about 92% at the wavelength emission. In a third preferred embodiment, the semi-transparent layer has a reflectivity of between about 92% and about 96.5% at the wavelength emission. In a fourth preferred embodiment, the semi-transparent layer has a reflectivity of between about 94% and about 96.5% at the wavelength emission. In a fifth preferred embodiment, the semi-transparent layer 122 has reflectivity greater than about 96% at the wavelength emission. In another preferred embodiment, the semi-transparent layer 122 has a reflectivity of at least 86% at an emission wavelength of from 400 nm to 500 nm. Examples of such anode material include silver, aluminum, gold and copper, as well as alloys of such metals.

The semi-transparent layer 122 can typically be fabricated using any of the techniques known in the art for deposition of thin films, including, for example, vacuum evaporation, sputter deposition, electron beam deposition, or chemical vapor deposition, using for example, pure metals or alloys or other film precursors. The thickness of the metal layer can be controlled by the rate and time of evaporation/deposition. A typical rate of evaporation/deposition is about 0.5 to 10 Å/sec. The thickness of the semi-transparent layer should be thin enough to transmit at least some light (so that it is semi-transparent), and thick enough to provide a continuous layer. Typically, the semi-transparent metal layer 122 has a thickness of from about 100 Å to about 500 Å. In a first preferred embodiment, the semi-transparent layer has a thickness of from about 250 to about 400 Å. In a second preferred embodiment, the semi-transparent layer has a thickness of from about 275 to about 350 Å. In a third preferred embodiment, the semi-transparent layer has a thickness of from about 275 to about 325 Å.

The optional passivation layer 128 of conductive material enables the use of high reflectivity metals with work functions that are not precisely matched with the emissive polymers being utilized. The exact form of conductive material useful in this invention may vary widely and is not critical. Examples of suitable conductive material include, but are not limited to, poly(aniline), poly(aniline) blends, polythiophenes, and polythiophene blends, Useful conductive poly(anilines) include the homopolymer, derivatives and blends with bulk polymers. Examples of useful poly (aniline) include those disclosed in U.S. Pat. Nos. 5,232,631 and 5,723,873. Useful conductive polythiophenes include the homopolymer, derivatives and blends with bulk polymers. Examples of useful polythiophenes include poly (ethylenedioxythiophenes) (PEDT), such as poly(3,4-ethylenedioxythiophene, and those disclosed in U.S. Pat. Nos. 5,766,515 and 5,035,926. The term "polyaniline" and "polythiophenes" are used herein generically to include substituted and unsubstituted materials. It is also used in a manner to include any accompanying dopants, particularly acidic materials used to render the material conductive.

Cathode

The first cathode layer 142 is selected from low work function metals or low work function metal-oxides (typically less than about 3.5 eV). Examples of suitable low work function materials include alkali, alkaline earth and lanthanide metals and oxides of alkali, alkaline earth and lanthanide metals. The term "alkali metal" is used herein in the conventional sense to refer to elements of Group IA of the periodic table. The term "alkali metal oxide" is used herein in the conventional sense to refer to compounds of an alkali metal and oxygen. For convenience, alkali metal oxides are referred to herein by the chemical formula of the corresponding simple oxide (e.g., $Li_2O$, $Na_2O$, $K_2O$, $Rb_2O$, and $Cs_2O$); however, this reference to the simple oxide is intended to encompass other oxides, including mixed oxides and non-stoichiometric oxides (e.g., $Li_xO$, $Na_xO$, $K_xO$, $Rb_xO$, and $Cs_xO$, where x is from about 0.1 to about 2).

The term "alkaline earth metal" is used herein in the conventional sense to refer to elements of Group IIA of the periodic table. Preferred alkaline earth metals include magnesium (i.e., Mg), calcium (i.e., Ca), strontium (i.e., Sr), and barium (ie., Ba). The term "alkaline earth metal oxide" is used herein in the conventional sense to refer to compounds of an alkaline earth metal and oxygen. For convenience, alkaline earth metal oxides are referred to herein by the chemical formula of the corresponding simple oxide (e.g., MgO, BaO, CaO; SrO, and BaO); however; this reference to the simple oxide is intended to encompass other oxides, including mixed oxides and non-stoichiometric oxides (e.g., $Mg_xO$, $Ba_xO$, $Ca_xO$, $Sr_xO$, and $Ba_xO$, where x is from about 0.1 to about 1.

The term "lanthanide metal" is used herein in the conventional sense to refer to elements of the lanthanide series of the periodic table, from cerium (i.e., Ce) through lutetium (i.e., Lu). Preferred lanthanide metals include samarium (i.e., Sm), Ytterbium (i.e., Yb), and neodymium (i.e., Nd). The term "lanthanide metal oxide" is used herein in the conventional sense to refer to compounds of a lanthanide metal and oxygen. For convenience, lanthanide metal oxides are referred to herein by the chemical formula of the corresponding simple oxide of the +3 valency state (e.g., $Sm_2O_3$, $Yb_2O_3$, and $Nd_2O_3$); however, this reference to the simple oxide is intended to encompass other oxides, including mixed oxides and non-stoichiometric oxides (e.g., $Sm_xO$, $Yb_xO$, and $Nd_xO$), where x is from about 0.1 to about 1.5.

In a preferred embodiment, first cathode layer 142 includes low work function metal oxides. The first cathode layer 142 can typically be deposited by thermal vacuum evaporation. Typically, the first cathode layer 142 has a thickness of from about 10 to 200 Å. A typical rate of evaporation/deposition is from about 0.2 to about 4 Å per second.

Like the semi-transparent layer 122, the second cathode layer 144 has a high reflectivity and a high work function, and is made of a material that can be formed into a smooth, contiguous film. Typically the second cathode layer 144 has a work function of greater than 4 eV In a preferred embodiment, the second cathode layer 144 has a reflectivity of at least 91.4% at emission wavelength. In a second preferred embodiment, the second cathode layer has a reflectivity of between 92% and 96.5% at the wavelength emission. In a third preferred embodiment, the second cathode layer has a reflectivity of between 94% and 96.5% at the wavelength emission. In a fourth preferred embodiment, the reflectivity of the second cathode layer is more than 96% at the wavelength emission. In another preferred embodiment, a metal that has a reflectivity of at least 86% at an emission wavelength of from 400 nm to 500 nm is used as the second cathode layer 144. As with the semi-transparent layer 122, the second cathode layer 144 includes a cathode material selected from metals and metal alloys. Examples of suitable high work function metals include aluminum, silver, copper, gold and the like, as well as alloys of such metals.

A preferred embodiment uses metal or metal alloy that has a reflectivity of at least 91.4% at the emission wavelength as both the semi-transparent layer 122 and as the second cathode layer 144. In another preferred embodiment, a metal that has a reflectivity of at least 86% at an emission wavelength of from 400 nm to 500 nm are used as both the semi-transparent layer 122 and as the second cathode layer 144.

In general, the second cathode layer 144 need not be the same material as used for the semi-transparent layer 122. For example, gold could be used for the high work function semi-transparent anode, and silver could be used as the high reflectivity metal layer in the bilayer cathode. In a preferred embodiment, the high reflectivity layer 142 has a metal with a reflectivity of at least 91.4%, or a reflectivity of at least 86% at an emission wavelength of from 400 nm to 500 nm, as both the second cathode layer 144 and as the semi-transparent layer 122. In a more preferred embodiment, silver (Ag) is used as both the high reflectivity metal layer in the bilayer cathode and as the semi-transparent anode.

Optionally, a multi-layer cathode system (not shown) can be used. For example, a first layer of high reflectivity cathode layer (preferably, of sufficient thickness to be opaque) may be covered by a layer of another high reflectivity cathode layer, which may be more or less reflective than the first high reflectivity cathode layer. In a tri-layer cathode-capping configuration, the uppermost metal may be any stable metal capable of forming a smooth, contiguous film, for example, aluminum or aluminum alloy. Subsequent layers can be added for specific function such as for example, for passivating and sealing of the device. Examples of layers useful for sealing the device include an air-stable capping layer. The term "air-stable" refers to the ability to protect the layers underneath the capping layer from ambient oxygen and moisture that may be present around the device. Suitable materials for air-stable capping layer include a metal or metal alloy.

As with the semi-transparent layer 122, the second cathode layer 144 can be fabricated using known deposition techniques. A typical rate of evaporation/deposition is from about 1 to 20 Å/sec. The thickness of the second cathode layer 144 should be thick enough to cover the first cathode layer and be opaque enough to give high reflectivity at the wavelength of interest. Typically, the second cathode layer has a thickness of at least about 800 Å.

Emissive Layers

In the LEDs of the present invention, the at least one emissive layer 130 (also referred to as the luminescent layer or the electroluminescent layer) comprises an electroluminescent, semiconducting, organic material. Generally, materials for use as emissive layers in LEDs include polymeric or molecular materials that exhibit electroluminescence, and still more specifically, materials that exhibit electroluminescence and that are soluble and processible from solution into uniform thin films.

Examples of useful molecular emissive materials include simple organic molecules such as anthracene, thiadiazole derivatives, and coumarin derivatives are known to show electroluminescence. In addition, complexes such as 8-hydroxyquinolate with trivalent metal ions, particularly aluminum are also suitable emissive materials, as described in, for example, Tang et al., U.S. Pat. No. 5,552,678.

Examples of useful polymeric emissive materials include semiconductive conjugated polymers. Examples of suitable semiconductive conjugated polymers include poly (phenylene vinylene), PPV, and soluble derivatives of PPV such as poly(2-methoxy-5-(2'-ethyl-hexyloxy)-1,4-phenylene vinylene), MEH-PPV, a semiconducting polymer with an energy gap $E_g$ of ~2.1 eV. This material is described in more detail in Wudl, F., Hoger, S., Zhang, C., Pakbaz, K., Heeger, A. J., *Polymer Preprints,* 1993, 34 (no. 1), 197. Another material described as useful in this application is poly(2,5-bis(cholestanoxy)-1,4-phenylene vinylene), BCHA-PPV, a semiconducting polymer with an energy gap $E_g$ of ~2.2 eV. This material is described in more detail in U.S. Pat. No. 5,189,136. Other suitable polymers include, for example, the poly(3-alkylthiophenes) as described by Braun, D., Gustafsson, G., McBranch D., and Heeger, A. J., *"Electroluminescence and electrical transport in poly*(3-*thiophene*) *diodes" J. Appl. Phys.,* 1992, 72, 564; poly(para-phenylene) as described by Grem, G., Leditzky, G., Ullrich, B., and Leising, G., *"Realization of blue-light-emitting device using poly*(-*p-phenylene*)*," Adv. Mater.,* 1992, 4, 36, and its soluble derivatives as described by Yang, Z., Sokolik, I., and Karasz F. E., *"Soluble blue light-emitting polymer," Macromolecules,* 1993, 26, 1188; and polyquinoline as described by Parker, I. D., Pei, Q., Marrocco, M., *"Efficient blue electroluminescence from a fluorinated polyquinoline" Appl. Phys. Lett.,* 1994, 65, 1272. Blends of conjugated semiconducting polymers with non-conjugated host or carrier polymers are also useful as the active layer in polymer LEDs, as described by Zhang, C., von Seggern, H., Pakbaz, K., Kraabel, B., Schmidt, H. -W., and Heeger, A. J., *"Blue electroluminescent diodes utilizing blends of poly*(*p-phenylphenylene vinylene*) *in poly*(9-*vinylcarbazole*)*," Syn-thetic Metals,* 1994, 62, 35. Also useful are blends comprising two or more conjugated polymers, as described by Yu, G., and Heeger, A. J., *"High efficiency photonic devices made with semiconducting polymers," Synthetic Metals,* 1997, 85, 1183.

In one embodiment, the electroluminescent, organic material is an electroluminescent, semiconducting, organic polymer, which polymer is a π-conjugated polymer or is a co-polymer which contains segments of π-conjugated moieties. Conjugated polymers are well known in the art. Suitable examples of electroluminescent, semiconducting, organic polymers include, but are in no way limited to:

(i) poly(p-phenylene vinylene) and its derivatives substituted at various positions on the phenylene moiety;
(ii) poly(p-phenylene vinylene) and its derivatives substituted at various positions on the vinylene moiety;
(iii) poly(p-phenylene vinylene) and its derivatives substituted at various positions on the phenylene moiety and also substituted at various positions on the vinylene moiety;
(iv) poly(arylene vinylene), where the arylene may be such moieties as naphthalene, anthracene, furylene, thienylene, oxadiazole, and the like;
(v) derivatives of poly(arylene vinylene), where the arylene may be as in (iv) above, and additionally have substituents at various positions on the arylene;
(vi) derivatives of poly(arylene vinylene), where the arylene may be as in (iv) above, and additionally have substituents at various positions on the vinylene;
(vii) derivatives of poly(arylene vinylene), where the arylene may be as in (iv) above, and additionally have substituents at various positions on the arylene and substituents at various positions on the vinylene;
(viii) co-polymers of arylene vinylene oligomers, such as those in (iv), (v), (vi), and (vii) with non-conjugated oligomers;
(ix) poly(p-phenylene) and its derivatives substituted at various positions on the phenylene moiety, including ladder polymer derivatives such as poly(9,9-dialkyl fluorene) and the like;
(x) poly(arylenes) where the arylene may be such moieties as naphthalene, anthracene, furylene, thienylene, oxadiazole, and the like; and their derivatives substituted at various positions on the arylene moiety;
(xi) co-polymers of oligoarylenes such as those in (x) with non-conjugated oligomers;
(xii) polyquinoline and its derivatives;
(xiii) co-polymers of polyquinoline with p-phenylene substituted on the phenylene with, for example, alkyl or alkoxy groups to provide solubility;
(xiv) rigid rod polymers such as poly(p-phenylene-2,6-benzobisthiazole), poly(p-phenylene-2,6-benzobisoxazole), poly(p-phenylene-2,6-benzimidazole), and their derivatives;

and the like.

Also useful are combinations of semiconducting conjugated polymers with discrete molecules, with the discrete molecular compounds blended with the semiconducting conjugated polymer or covalently attached to via a covalent bond. Also useful are poly(fluorene) derivatives. See for example, U.S. Pat. Nos. 5,777,070; 5,708,130; and 5,900,327.

In one embodiment, the electroluminescent, semiconducting, organic material is an electroluminescent, semiconducting, organic polymer. In preferred embodiments, the electroluminescent, semiconducting, organic material is selected from the group consisting of: poly(p-phenylene vinylene)s, poly(arylene vinylene)s, poly (p-phenylene)s, and poly(arylene)s.

The emissive layer may also comprise other materials, such as carrier polymers and additives. Typically, the emissive layer has a thickness of about 600 to about 1100 A, depending on the desired wavelength of emission and hence the cavity size.

The emissive layer can typically be fabricated using any of the techniques known in the art, particularly those methods known in the art of organic molecular and organic polymer LEDs, including, for example, casting directly from solution, and casting of a polymer precursor followed by reaction (e.g., by heating) to form the desired polymer.

Figure 2:
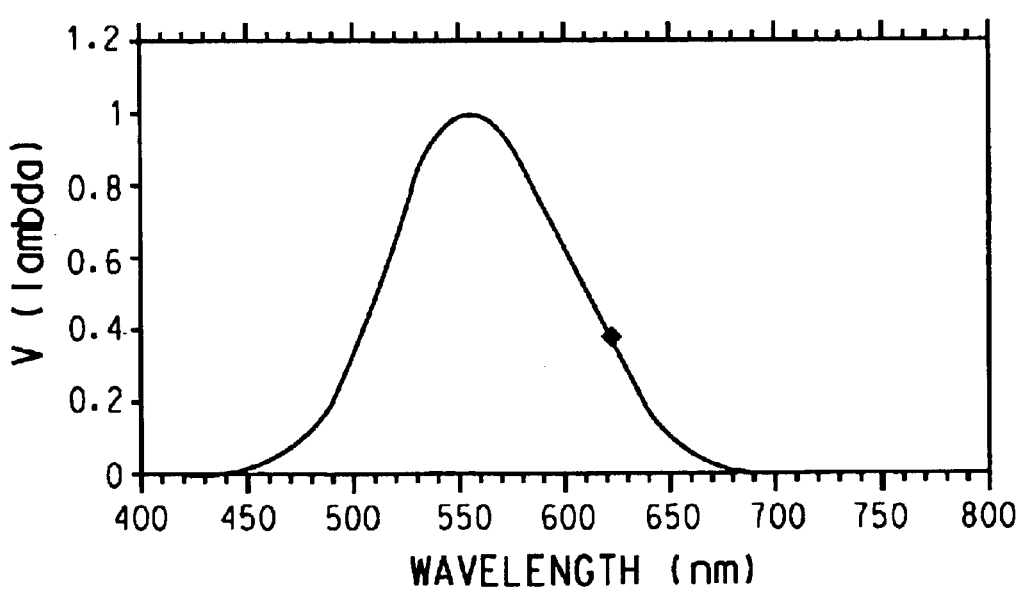
FIG. 2 shows the sensitivity of the human eye to light, as a function of wavelength.
Figure 3:
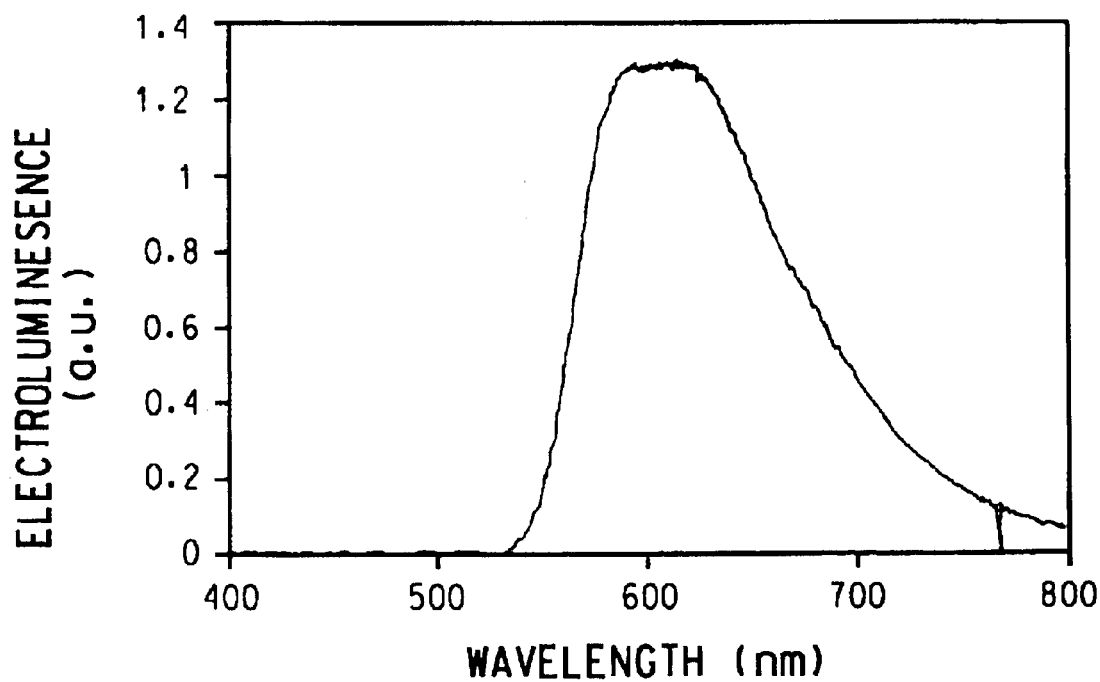
FIG. 3 shows the electroluminescence spectrum of a comparative example polymer LED made using Covion PDO 122, with an ITO electrode and a Ba/Al electrode (Comparative Example A).

We have found that using a multi-layer cathode comprising at least one ultrathin layer of the low work function metal or metal-oxide (for efficient electron injection) capped with a high reflectivity metal, together with an anode comprising a semi-transparent, high reflectivity metal layer, one achieves excellent electron injection, high reflectivity, high Q in a microcavity architecture, and thereby improved luminous efficiency and improved radiance. It is believed that a microcavity effect enhances the luminous efficiency and brightness. The relatively high reflectivity of the semi-transparent metal anode and the cathode bilayer of the device result in the formation of the high performance polymer LED in a microcavity structure. The microcavity effect results in a narrowing of the bandwidth of light emitted. The result of this narrowing is to shift the wavelength of the majority of the photons emitted to an area where the human eye is more sensitive (see FIG. 2) and thereby to significantly increase the luminous efficiency of the light emitting structure. The broad electroluminescence spectrum of a polymer LED fabricated in the traditional structure with the same luminescent polymer is shown for comparison in FIG. 3.

Encapsulation

It is typically preferred to encapsulate the LEDs of the present invention to prevent long term degradation. Methods of encapsulation are well known in the art. For example, devices can be sealed between glass plates, or sealed between barrier polymer layers.

EXAMPLES

The following examples illustrate certain features and advantages of the present invention. They are intended to be illustrative of the invention, but not limiting.

In the Examples and Comparative Examples below, the following procedure was followed to determine the following measurements:

Efficiency:

Efficiencies were measured using a UDT S370 optometer (available from UDT, a part of Gamma Scientific, of San Diego, Calif.) which includes a photodiode that is calibrated using the procedure described below: The photodiode is calibrated as follows: A NIST calibrated light source, with a known, uniform light emission was used. A mask was used so that only a light beam the size of the pixel active area was emitted. The photodiode was placed at a given distance from the light, and the number of volts were recorded. Thus, the number of volts corresponding to a particular light intensity (340 cd/m$^2$) were known.

Radiance:

Radiance was measured using a Newport photodiode (available from Newport Corporation of Irvine, Calif.)

Lifetime:

For operational lifetime testing the LEDs were sealed using an epoxy resin and a glass cover. Lifetime testing was carried out, in air, on individual pixels in a device at constant current, 0.5 msec pulses, 0.5% duty cycle, at 5 mA per pixel. The time required for a pixel to decay to zero light output was measured using the UDT S370 optometer with the calibrated photodiode.

Comparative Example A

A polymer LED device was fabricated as follows: On a glass substrate partially coated with ITO was spin-coated at 6,000 rpm in air, a solution of poly(aniline) blend (general method of preparation is described in U.S. Pat. No. 5,626,795). The resulting film was dried on a hot plate at 50° C. for 30 minutes and then overnight under vacuum at 70° C. A toluene solution of Covion PDO 122, available from Covion Organic Semiconductors GmbH (Frankfurt, Germany), was spincoated at 1,800 rpm onto the pAni thin film (in a nitrogen glove box). The film was dried under vacuum at room temperature for 1 hour. A barium cathode was vapor deposited on the polymeric film of Covion PDO 122 to a thickness of 30 angstroms. A layer of aluminum was vapor deposited on top of the barium layer to a thickness of 3,000 Å.

Comparative Example B

A polymer LED device was fabricated as in Comparative Example A, except that the aluminum was replaced with a vapor deposited layer of silver at a thickness of 3,000 Å.

Example 1

A polymer LED device was fabricated as in Comparative Example A, except that the ITO was replaced with a vapor deposited layer of silver at a thickness of 300 Å.

Example 2

A polymer LED device was fabricated as in Comparative Example A, except that a layer of silver at a thickness of 300 Å was vapor deposited on top of the ITO. The performance of this device is similar to that of Example 1 and Example 3, as described below.

Example 3

A polymer LED device was fabricated as described in Example 1 or Example 2 except that the aluminum layer was replaced with a vapor deposited layer of silver at a thickness of 3,000 Å. Efficiency of these devices were measured.

The performance of the devices is summarized in Table 1:

TABLE 1

Efficiency (cd/A) & Operating Voltage at 0.3 mA of Devices

| Example No. | Efficiency at 0.3 mA (Cd/A) | Voltage (V) |
| --- | --- | --- |
| Comp. Example A | 5.25 | 11.3 |
| Comp. Example B | 4.54 | 9.6 |
| Example 1 | 5.9 | 10.2 |
| Example 3 | 9.5 | 10.4 |

Table 1 above shows that replacement of ITO with 300 Å of silver (but leaving the aluminum in place) improves the light output somewhat, yielding a 12% increase in brightness (i.e., Comparative Example A vs. Example 1). However, the most dramatic improvement is achieved in devices of the structure described by Example 3, where a silver anode is used, and silver is the high reflectivity metal used in the bilayer cathode structure. The device from Example 3 is more than 80% brighter than that of the device in Comparative Example A. Table 1 also illustrates that simply replacing aluminum with silver at the cathode side (Comparative Example A vs. B) and leaving the anode side unchanged does not improve the efficiency of the device. In fact, there is a reduction in light output.

The emission from the devices of the Examples 1 and 3 was also be measured in radiometric units (W/Sr/m$^2$), which measurement ignores the effect of the human eye response and measures light output in absolute terms. Results are summarized in Table 2 below. Note that the radiance from the device fabricated according to this invention (Example 3) was 2.5 times greater than that from a device fabricated in the traditional polymer LED structure with the same luminescent polymer.

Figure 4:
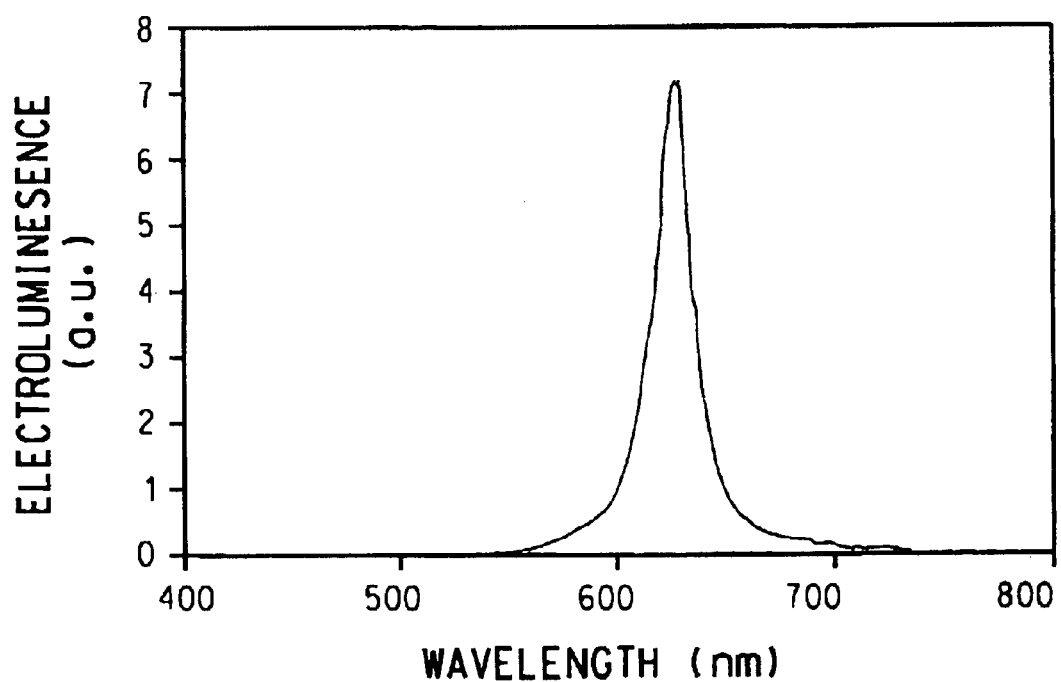
FIG. 4 shows the electroluminescence spectrum of a polymer LED of the present invention, with a 300 Å silver anode and a Ba/Ag electrode (Example 3).

FIG. 4 shows the electroluminesence spectrum of a device from Example 3. Note the narrowing of the electroluminescence emission relative to the spectrum seen in FIG. 3, even though the same emissive polymer is used in both devices. It is believed that confinement of the Covion PDO 122 in the microcavity of Example 3 results in narrowing of the emission.

TABLE 2

Radiance of Devices

| Example No. | Radiance at 0.3 mA (W/Sr/m2) |
|---|---|
| Comp. Example A | 32 |
| Comp. Example B | 28 |
| Example 1 | 41 |
| Example 3 | 102 |

Comparative Example C

A polymer LED device was fabricated as in Comparative Example A, except that the semi-conducting conjugated polymer employed was Covion PDY 131, available from Covion Organic Semiconductors GmbH (Frankfurt, Germany), and the film of Covion PDY 131 was spincoated at 3,000 rpm. The barium layer thickness was 15 Å.

Figure 5:
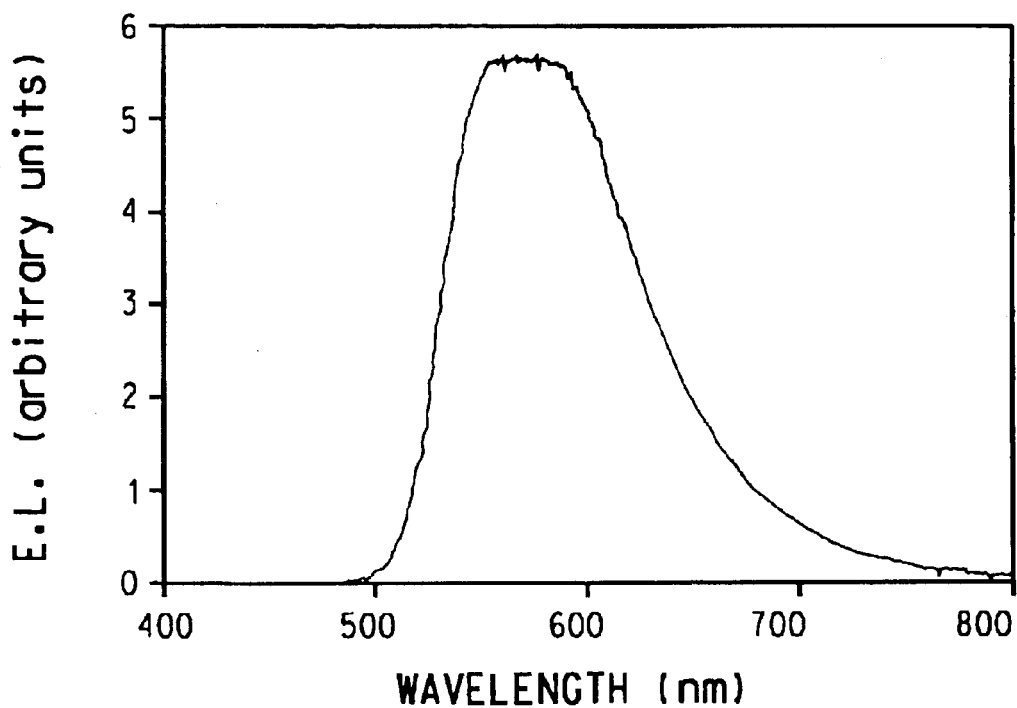
FIG. 5 shows the electroluminescence spectrum of a comparative polymer LED made using Covion PDY 131 with an ITO electrode and a Ba/Al electrode (Comparative Example C).

The electroluminescence spectrum of this device is shown in FIG. 5.

Example 4

A polymer LED device was fabricated as in Example 3 except that the semi-conducting conjugated polymer employed was Covion PDY 131 and the film of Covion PDY 131 was spincoated at 3,000 rpm. The Ba thickness was 15 Å.

Figure 6:
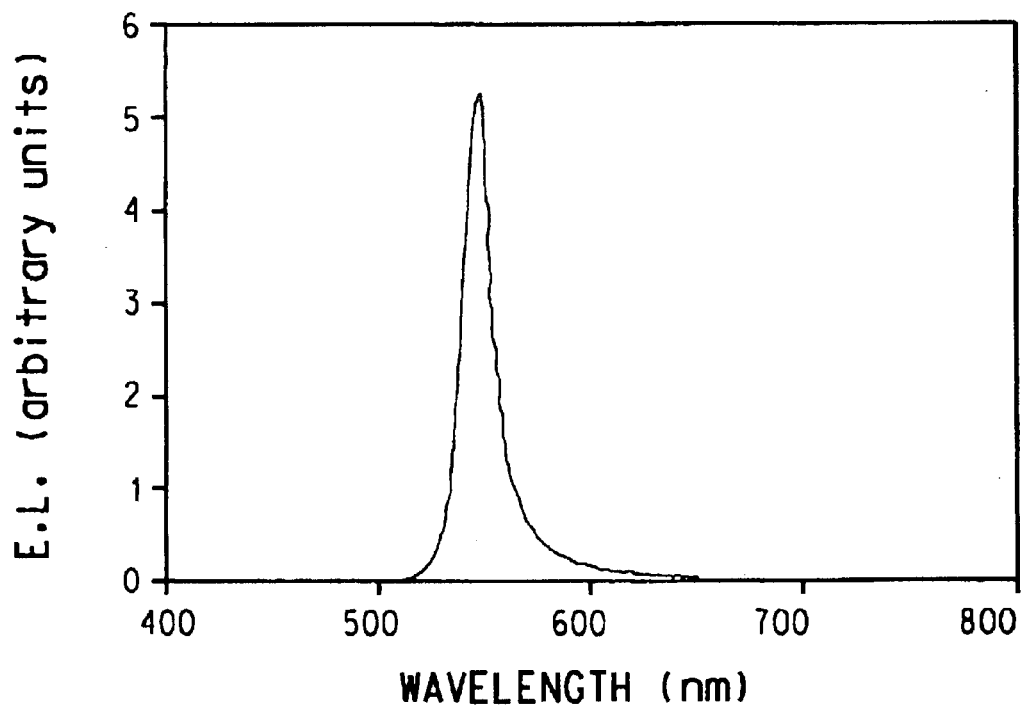
FIG. 6 shows the electroluminescence spectrum of a polymer LED of the present invention, made using Covion PDY 131, with a 300 Å silver anode and a Ba/Ag cathode (Example 4).

The electroluminescence spectrum of this device is shown in FIG. 6.

TABLE 3

Efficiency (cd/A) & Operating Voltage at 0.3 mA of Devices of the Examples

| Example No. | Efficient (cd/A) | Voltage (V) |
|---|---|---|
| Comparative Example C | 10.8 | 8.9 |
| Example 4 | 27.4 | 10 |

TABLE 4

Radiance of Devices of the Examples

| Example No. | Radiance at 0.3 mA (W/Sr/m$^2$) |
|---|---|
| Comparative Example C | 36 |
| Example 4 | 83 |

Tables 3 and 4 above show results from devices of Comparative Example C and Example 4. It is clear that the invention is not limited to one semi-conducting polymer, because major improvements in light output are also realized with another semi-conducting polymer, when the cathode capping metal is changed from aluminum to silver, and the ITO is replaced by silver at the anode side. The device from Example 4 exhibited a luminous efficiency that was 2.5 times greater than that of the device in Comparative Example C (Table 3).

Figure 7:
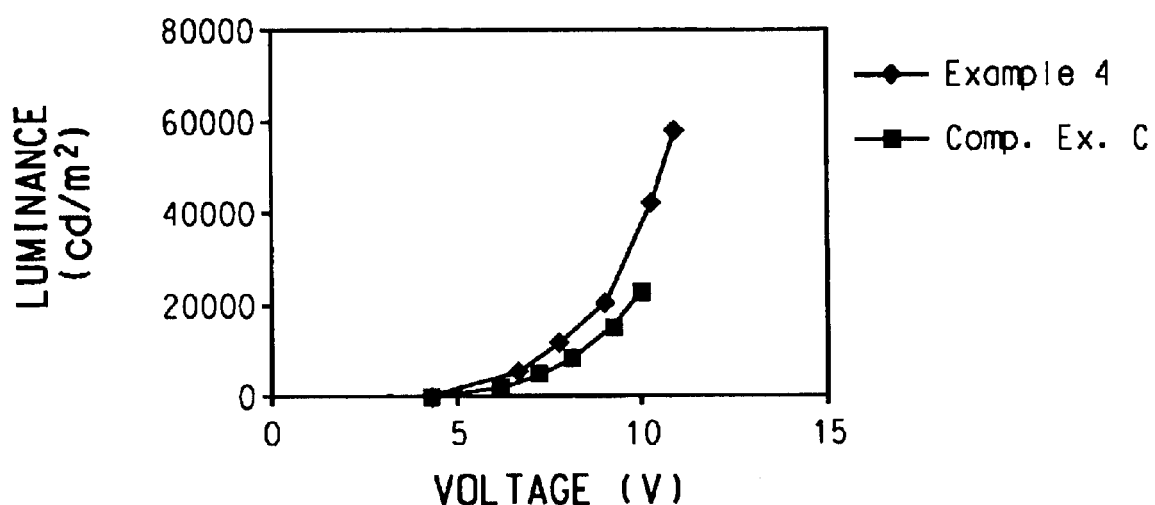
FIG. 7 shows a plot of the luminance vs. voltage curves from devices of Example 4 and Comparative Example C.

The light output vs voltage (L-V) curves for the devices of Example 4 and Comparative Example C were measured and the measurement shown in FIG. 7. The data in FIG. 7 demonstrate that significantly higher brightness was obtained from the device fabricated in Example 4.

Table 5 below shows that the devices of Examples 1 and 3 have a longer lifetime and are more stable that the comparative device that includes an ITO anode layer.

TABLE 5

Lifetimes of Devices Under High Current (Stress) Conditions

| Example No. | Time (h) to zero light output |
|---|---|
| Comparative Example A | 2.5 |
| Example 1 | Not reached at end of test (15 hrs.) |
| Example 3 | Not reached at end of test (15 hrs) |

The devices of Examples 1 and 3 as well as Comparative Example A were tested under what is considered to be very high current conditions (0.5 msec pulses, 0.5% duty cycle, at 5 mA per pixel) in order to accelerate the aging process and thus enable testing of many devices. Of the three devices, the device of Comparative Example A emitted the least light and decreased to zero most rapidly (no light emission after 2.5 hours). The devices of Examples 1 and 3 exhibit very different behavior over their lifetimes. In each case, the brightness decreases to approximately 50% of the initial value and then remains at that level. In the cases of devices from Examples 1 and 3, the point of failure could not be reached before testing was deemed complete.

Therefore, while ITO is generally preferred over silver as the anode layer, the present invention obtains improved operating lifetimes with the silver structure than with ITO devices.

What is claimed is:

1. A light-emitting device comprising:
   an anode comprising a semi-transparent layer having a high reflectivity and a high work function, wherein the semi-transparent layer has a reflectivity of at least 86%; and
   a cathode comprising at least one first cathode layer of a low work function material selected from metal, metal oxide and combinations thereof, and at least one second cathode layer having a high reflectivity and a high work function,
   at least one emissive layer disposed between the anode and first cathode layer wherein the emissive layer is in contact with the first cathode layer,
   wherein said device is a metal etalon microcavity structure.

2. The device of claim 1, wherein the semi-transparent layer has a work function of greater than 4 eV.

3. The device of claim 1, wherein the semi-transparent layer includes an anode material selected from metals and metal alloys.

4. The device of claim 1, wherein the second cathode layer has a work function of greater than 4 eV.

5. The device of claim 1, wherein the second cathode layer includes a cathode material selected from metals and metal alloys.

6. The device of claim 1 wherein the semi-transparent layer has a reflectivity of at least 91.4% at the wavelength of emission.

7. The device of claim 1 wherein the semi-transparent layer has a reflectivity of more than about 92% at the wavelength of emission.

8. The device of claim 1 wherein the semi-transparent layer has a reflectivity of from 92 to 96.5% at the wavelength of emission.

9. The device of claim 1 wherein the semi-transparent layer has a reflectivity of from 94 to 96.5% at the wavelength of emission.

10. The device of claim 1 wherein the semi-transparent layer has a reflectivity of more than about 96% at the wavelength of emission.

11. The device of claim 1 wherein the semi-transparent layer comprises silver.

12. The device of claim 1 wherein the at least one second cathode layer comprises silver.

13. The device of claim 1 wherein the at least one second cathode layer has reflectivity of at least 91.4% at the wavelength of emission.

14. The device of claim 1 wherein the at least one second cathode layer has reflectivity of between about 92 and 96.5% at the wavelength of emission.

15. The device of claim 1 wherein the at least one second cathode layer has reflectivity of between about 94 to 96.5 % at the wavelength of emission.

16. The device of claim 1 wherein the at least one second cathode layer has reflectivity of greater than about 96% at the wavelength of emission.

17. The device of claim 1 wherein the at least one second cathode layer includes a layer of air-stable metal coated on a silver layer.

18. The device of claim 1 wherein:

the semi-transparent layer has a first surface adjacent to the cathode and an opposite second surface;

the anode further comprising a passivation layer adjacent to the first surface, the passivation layer comprising a passivation material selected from poly(aniline), poly(aniline) blends, polythiophene, and polythiophene blends.

19. The device of claim 1 wherein the semi-transparent layer has a thickness of from about 100 up to 500 Å.

20. The device of claim 1 wherein the semi-transparent layer has a thickness of from about 250 up to 400 Å.

21. The device of claim 1 wherein the semi-transparent layer has a thickness of from about 275 up to 350 Å.

22. The device of claim 1 wherein the semi-transparent layer has a thickness of from about 275 up to 325 Å.

23. The device of claim 1, wherein:

the semi-transparent layer has a first surface adjacent to the cathode and an opposite second surface;

the anode further comprises a transparent layer of indium/tin oxide adjacent to the second surface of the semi-transparent layer.

* * * * *